United States Patent
Bhunia et al.

(10) Patent No.: US 10,283,459 B2
(45) Date of Patent: May 7, 2019

(54) VANISHING VIA FOR HARDWARE IP PROTECTION FROM REVERSE ENGINEERING

(71) Applicant: University of Florida Research Foundation, Incorporated, Gainesville, FL (US)

(72) Inventors: Swarup Bhunia, Gainesville, FL (US); Haoting Shen, Tallahassee, FL (US); Mark M. Tehranipoor, Gainesville, FL (US); Domenic J. Forte, Gainesville, FL (US); Navid Asadizanjani, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 15/863,133

(22) Filed: Jan. 5, 2018

(65) Prior Publication Data

US 2018/0197828 A1  Jul. 12, 2018

Related U.S. Application Data

(60) Provisional application No. 62/443,100, filed on Jan. 6, 2017.

(51) Int. Cl.
*H01L 23/00* (2006.01)
*B81B 7/00* (2006.01)
(Continued)

(52) U.S. Cl.
CPC .......... *H01L 23/573* (2013.01); *B81B 7/0012* (2013.01); *H01H 29/02* (2013.01); *H01H 59/0009* (2013.01); *H01L 23/525* (2013.01); *H01L 23/528* (2013.01); *H01L 23/5228* (2013.01); *H01L 23/5252* (2013.01); *H01L 23/53238* (2013.01); *B81B 2201/01* (2013.01);
(Continued)

(58) Field of Classification Search
CPC .... H01L 23/57–23/573; H01L 23/5252; H01L 45/04–45/1691; H01L 23/528; H01L 23/525; H01L 21/768–21/76898; H01H 29/00–29/32
See application file for complete search history.

(56) References Cited

U.S. PATENT DOCUMENTS

2010/0140779 A1* 6/2010 Lin .................. H01L 23/49816
257/690
2018/0068941 A1* 3/2018 Howard .............. H01L 23/528

OTHER PUBLICATIONS

Sacchetto et al., Resistive Programmable Through-Silicon Vias for Reconfigurable 3-D Fabrics, Jan. 2012, IEEE Transactions on Nanotechnology, vol. 11 No. 1, pp. 8-11.*

(Continued)

*Primary Examiner* — Selim U Ahmed
*Assistant Examiner* — Evan G Clinton
(74) *Attorney, Agent, or Firm* — Alston & Bird LLP

(57) ABSTRACT

A semiconductor device can include a first metal trace, a first via disposed on the first metal trace, a second metal trace disposed on the first via, and an insulator interposed between the first metal trace and the first via. The insulator can be configured to lower an energy barrier or redistribute structure defects or charge carriers, such that the first metal trace and the first via are electrically connected to each other when power is applied. The semiconductor device can further include a dummy via disposed on the first metal trace.

17 Claims, 4 Drawing Sheets

(51) Int. Cl.
*H01L 23/522* (2006.01)
*H01L 23/525* (2006.01)
*H01L 23/532* (2006.01)
*H01H 59/00* (2006.01)
*H01H 29/02* (2006.01)
*H01L 23/528* (2006.01)

(52) U.S. Cl.
CPC ... *B81B 2201/014* (2013.01); *B81B 2201/018* (2013.01); *B81B 2207/07* (2013.01)

(56) References Cited

OTHER PUBLICATIONS

Bohr et al., "Intel's revolutionary 22 nm transistor technology," Intel, May 2011, pp. 1-27, http://download.intel.com/newsroom/kits/22nm/pdfs/22nm-Details_Presentation.pdf.

M. E. International, 2011. [Online]. Available: http://www.mei4pcbs.com/technology. Internet Archived between Oct. 28, 2011 and Oct. 20, 2017 by the Wayback Machine at <https://web.archive.org/web/20111028152531/http://www.mei4pcbs.com/technology> retrieved Sep. 6, 2018, 2 pages.

\* cited by examiner

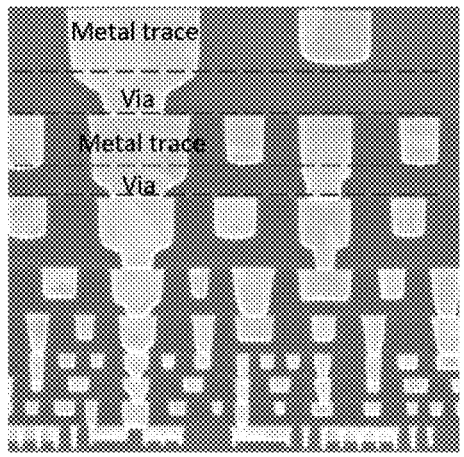 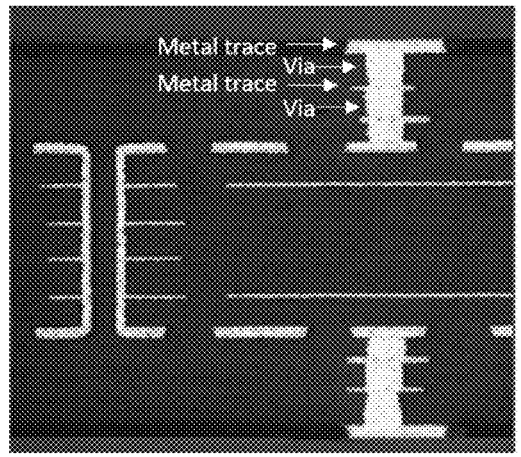
Figure 1(a) (Prior art)   Figure 1(b) (Prior art)
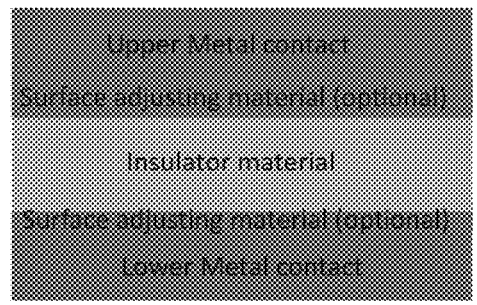
Figure 2

VANISHING VIA FOR HARDWARE IP PROTECTION FROM REVERSE ENGINEERING

CROSS-REFERENCE TO RELATED APPLICATION

This application claims the benefit of U.S. Provisional Application Ser. No. 62/443,100, filed Jan. 6, 2017, which is incorporated herein by reference in its entirety, including any figures, tables, and drawings.

STATEMENT OF GOVERNMENT SUPPORT

This invention was made with government support under grant number FA9550-14-1-0351 awarded by the United States Air Force Office of Scientific Research. The government has certain rights in the invention.

BACKGROUND

Most modern integrated circuit (IC) chips and printed circuit boards (PCBs) contain multiple layers. Metal traces are employed to realize the (horizontal) circuit connections within one layer while vias are used for the (vertical) interconnection between different layers. Successful reverse engineering performed on electronic devices consisting of IC chips and PCBs provides a comprehensive understanding of a device's structure, including the components and the connections among each component. This provides a method for extracting layout files from a given device. As a result, an adversary can obtain access to the entire design, potentially leading to cloning, intellectual property (IP) infringement, and even hardware Trojan insertion.

BRIEF SUMMARY

Embodiments of the subject invention provide novel and advantageous integrated circuit (IC) chips and printed circuit boards (PCBs) that include a vanishing via to hide or obfuscate the original circuit topologies unless the user provides the right key.

In an embodiment, a semiconductor device can include a first metal trace, a first via disposed on the first metal trace, a second metal trace disposed on the first via, and an insulator interposed between the first metal trace and the first via, wherein the insulator is configured to lower an energy barrier or redistribute structure defects or charge carriers such that the first metal trace and the first via are electrically connected to each other when power is applied.

In another embodiment, an IC can include a first metal trace, an inter metal dielectric disposed on the first metal trace, a first via formed in the inter metal dielectric, a second via formed in the inter metal dielectric, a second metal trace disposed on the first via, a third metal trace disposed on the second via, and a first switch between the second metal trace and the third metal trace.

In yet another embodiment, an IC can include a first metal trace, an inter metal dielectric disposed on the first metal trace, a first via formed in the inter metal dielectric, a second via formed in the inter metal dielectric, a second metal trace disposed on the first via, a third metal trace disposed on the second via, and a first liquid metal droplet between the second metal trace and the third metal trace.

In yet another embodiment, an IC device can include a PCB including a unique ID, and a chip mounted on the PCB and having an encrypted key, wherein a via of the PCB is programed by the encrypted key of the chip.

BRIEF DESCRIPTION OF THE DRAWINGS

FIG. 1(a) shows a cross-sectional image of an integrated circuit (IC) chip.

FIG. 1(b) shows a cross-sectional image of a printed circuit board (PCB).

FIG. 2 shows a memristor structure according to an embodiment of the subject invention.

DETAILED DESCRIPTION

Figure 3:
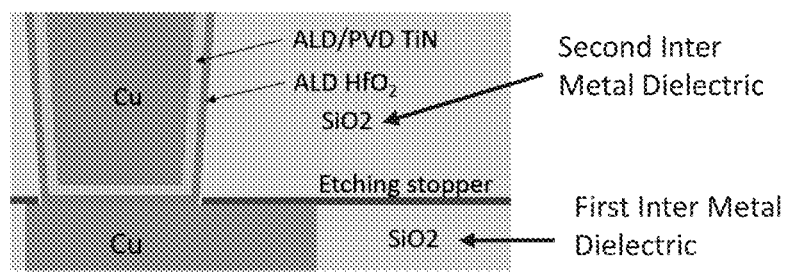
FIG. 3 shows an interconnection via with an embedded memristor according to an embodiment of the subject invention.

Embodiments of the subject invention provide novel and advantageous vanishing vias that can be applied in an integrated circuit (IC) chip and a printed circuit board (PCB). By adding a memristor between a via and a metal trace or by connecting an actual via and a vanishing via through a switch or a liquid metal, the IC chip can be protected from reverse engineering. In addition, a PCB using a vanishing via can be protected from reverse engineering by generating a unique ID based on process-induced variation.

Embodiments protect electronic devices from reverse engineering and other threats based on reverse engineering, such as cloning, intellectual property (IP) infringement, and hardware Trojan insertion. Many embodiments include a vanishing version of a via, which is the interconnection in electronic devices.

Memristor, Micro-electro-mechanical systems (MEMS), and liquid metals can be used for vias, allowing the vias to be switched between connection (working) and disconnection (vanishing) status. During the operation of the device, a configuration key is required to correctly set the status of the via and enable the device's functions. Once the operation is finished, the vias can be set as disconnected, making the interconnection "vanished". In addition, dummy vias can be added for obfuscation, so that it is extremely difficult, if possible at all, for an adversary to understand the device's structure. Without a correct understanding, it is not likely to be possible to implement cloning, IP infringement, or hardware Trojan insertion.

For most electronic devices, typical reverse engineering can provide a comprehensive understanding of a device's structure. This provides a method for extraction of layout files from a given device and makes cloning, IP infringement, and hardware Trojan insertion possible. Programmable devices, such as FPGA, can inhibit reverse engineering by resetting the configurations after, but it is costly. The "vanishing via" described herein can be realized in a simpler structure, with lower cost, and greater efficiency.

FIGS. 1(a) and 1(b) show a cross-sectional image of an IC chip and a cross-sectional image of a PCB, respectively. FIG. 1(a) shows a cross section of an IC chip manufactured based on 22-nm node technology [1], and FIG. 1(b) shows a cross section of high density interconnect PCB [2]. Referring to FIG. 1(a), metal traces are employed to realize the (horizontal) circuit connections within one layer while vias are used for the (vertical) interconnection between different layers. Referring to FIG. 1(b), the PCB similarly includes metal traces and vias in order to interconnect electrically. However, successful reverse engineering performed on electronic devices consisting of IC chips and PCBs provides a comprehensive understanding of a device's structure, including the components and the connections among each components. This provides a method for extracting layout files from a given device. As a result, an adversary can obtain access to the entire design, potentially leading to cloning, IP infringement, and even hardware Trojan insertion.

Typical reverse engineering relies on electrical test and device structure characterization. Microscopy assisted probing (e.g., X-tomography, SEM, and FIB) are the most common techniques to reveal a device's design. One method to protect the design details is to make device structures difficult to be correctly imaged by microscopes. However, this is very difficult since reverse engineering techniques are becoming more advanced. Another method is to design mechanisms that obfuscate the original circuit topologies unless the user provides the right key. The vanishing via concept of embodiments of the subject invention provides such a mechanism. It is based on the idea that some specially designed interconnections in IC chips are valid only when a correct key is given. Three techniques that can be used to enable vanishing vias according to embodiments of the subject invention are based on (1) memristor, (2) MEMS, and (3) liquid metal.

FIG. 2 shows a memristor structure according to an embodiment of the subject invention. The memristor is based on a metal-insulator-metal structure. Referring to FIG. 2, the memristor comprises a lower metal contact, an insulator material disposed on the lower metal contact, and an upper metal contact disposed on the insulator material. Materials such as ZnO, $HfO_2$, or others can be used as the insulator material. In addition, a surface adjusting material may optionally be included between the metal contacts and the insulator material. When a suitable electrical field is applied, the distribution of defects such as oxide vacancies in the insulator material are changed, either lowering the energy barrier for charge carrier transport or forming a "filament" of high conductivity, thereby altering the insulator material's resistance. That is, the memristor is set as ON state by applying the electrical field.

FIG. 3 shows an interconnection via with an embedded memristor according to an embodiment of the subject invention. Referring to FIG. 3, to protect the logic design of an IC chip, the memristors can be deposited into interconnection vias. In this configuration, the metal contact for the memristor can be made of metal (e.g., Cu) that also serves as traces in ICs. The insulating material can be made of any suitable material known in the art (e.g., $HfO_2$), and the surface adjustment can be done by, for example TiN, which serves as a metal (e.g., Cu) diffusion barrier in CMOS chips. Both $HfO_2$ and TiN can be deposited by atomic layer deposition (ALD), which is compatible with current CMOS processes. The resistance difference between two states of the memristor is so high that the memristor can actually be used as a switch (on/off).

In FIG. 3, for demonstrative purposes only, copper (Cu) is used as a metal trace and a via in a semiconductor device and the copper metal trace and the copper via are formed in the Inter Metal Dielectric (IMD), such as $SiO_2$. In particular, the copper metal trace is formed in a first IMD, and then the copper metal trace and the first IMD is covered by an etching stopper and a second IMD. A region of the etching stopper and the second IMD corresponding to the copper via can be removed such that a top surface of the copper metal trace is exposed and an insulator, such as $HfO_2$, is deposited in the removed second IMD (e.g., by ALD). The copper via is deposited on the insulator in the removed second IMD, and the barrier layer (e.g., TiN) for the copper via can be interposed between the ALD $HfO_2$ and the copper via. The barrier layer can be deposited by, for example, ALD or physical vapor deposition (PVD).

Figure 4:
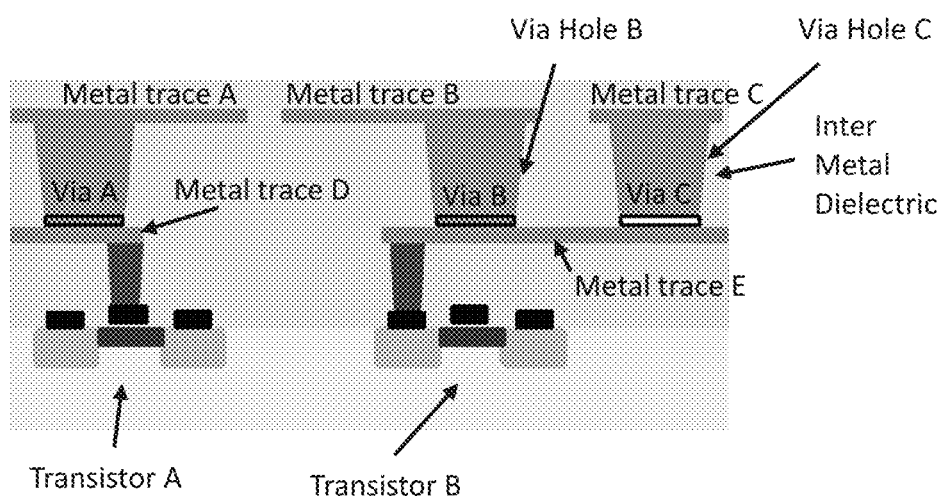
FIG. 4 shows a vanishing via including a memristor-embedded via according to an embodiment of the subject invention.

FIG. 4 shows a vanishing via including a memristor-embedded via according to an embodiment of the subject invention. Referring to FIG. 4, a plurality of transistors of the semiconductor device can be connected to each other through a plurality of metal traces and a plurality of vias, wherein the vias are fabricated with a memristor embedded in them. A Via A is connected to a Transistor A through a Metal trace D and should be able to connect electrically a Metal trace A to the Metal trace D in order to operate the Transistor A. Similarly, a Via B is connected to a Transistor B through a Metal trace E and should be able to connect electrically a Metal trace B to the Metal trace E in order to operate the Transistor B. However, while a Via C is disposed on the Metal trace E connected to the Transistor B, the Via C should not connect electrically a Metal trace C to the Metal trace E because the Via C is a dummy via for obfuscation. That is, even if the Vias A, B, and C have the same material structure, Via C does not provide an electrical connection to the transistors in a normal operation situation.

When the power is OFF, the vias (e.g. Via A, B, and C) are all set as OFF. To make the chips work correctly, via programming is necessary. Right vias (e.g., Via A and B) have to be selected to be set as ON by setting the memristors in the vias to the low resistance state. The remaining vias (e.g., Via C) work as dummy vias for obfuscation. Because the resistance change mechanism is based on the re-distribution of atomic-level structural defects in memristors, it is almost impossible for a microscope to reveal the structural differences between on and off memristors. Additionally, the memristor status can be set and reset several times, which means that when the authorized operation is done the vias can be reset, leaving all vias OFF, as though the interconnections are gone, and the vias will have vanished. As a result, the chip's logic function will be hidden. In addition, unauthorized users will not be able to use the chip unless the vias are correctly programmed again. Although it is theoretically possible for adversaries to figure out the original logic design by individually setting each via ON or OFF and testing the circuit function, the exponential number of possible combinations would make that approach extremely time consuming and therefore infeasible. In addition, dummy vanishing vias are also added into the circuit to further increase the number of possible combinations. Adversaries will have no idea about which vias are real and which are dummies, making it nearly impossible for the adversaries to determine which need to be set.

The Via C as a dummy via has the same structure as the Via B that functions as an actual via connection, so the manufacturer does not need an extra process. For example, a Via Hole C is formed in an Inter Metal Dielectric (IMD) at the same time when a Via Hole B is formed in the IMD. In addition, the Via C is simultaneously formed in the Via Hole C when the Via B is formed in the Via Hole B.

Figure 5:
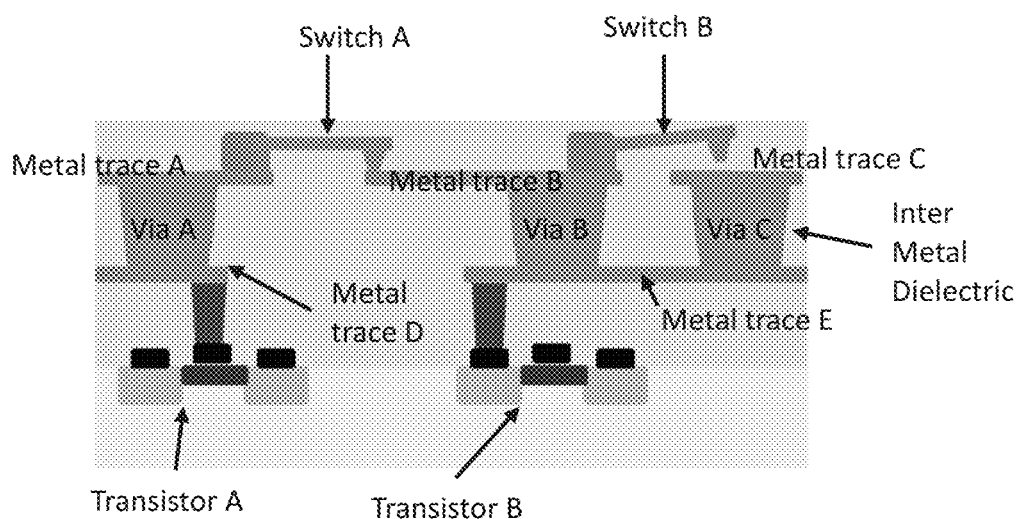
FIG. 5 shows a vanishing via including a Micro Electro Mechanical System (MEMS) switch according to an embodiment of the subject invention.

FIG. 5 shows a vanishing via including a MEMS switch according to an embodiment of the subject invention. Referring to FIG. 5, the IC chip includes a plurality of transistors, a plurality of metal traces, a plurality of vias, and a switch connecting the metal traces. The Transistor A and the transistor B operates through the metal traces A, B, D, and E, the Vias A and B, and a Switch A connecting the Metal trace A and the Metal trace B. Even though the Switch B is placed between the Metal trace B and the Metal trace C connected to the Via C, the Switch B does not electrically connect the Metal trace B and the Metal trace C. The Switches A and B can be made by Micro-electro-mechanical systems (MEMS). The MEMS include moving parts that can be controlled by electrical signals, thereby selectively connecting the metal traces based on applied signal. Through proper design, MEMS can connect and disconnect paths by utilizing their moving parts. Such mechanisms can be used for a vanishing via, in a manner similar to the memristor.

For example, the switches (e.g., A and B) in IC chips can be realized by MEMS. When the power is on, with programming authorized by the correct key, proper connections (e.g., Switch A) can be set up while dummy switches (e.g., Switch B) are kept as disconnected. Once the power is off, all switches are disconnected, the interconnections (i.e., vias) are gone. Therefore, without the right key, an adversary is not able to correctly program the connections and therefore cannot understand the logic design of the IC chips even if they have access to the chip.

Figure 6:
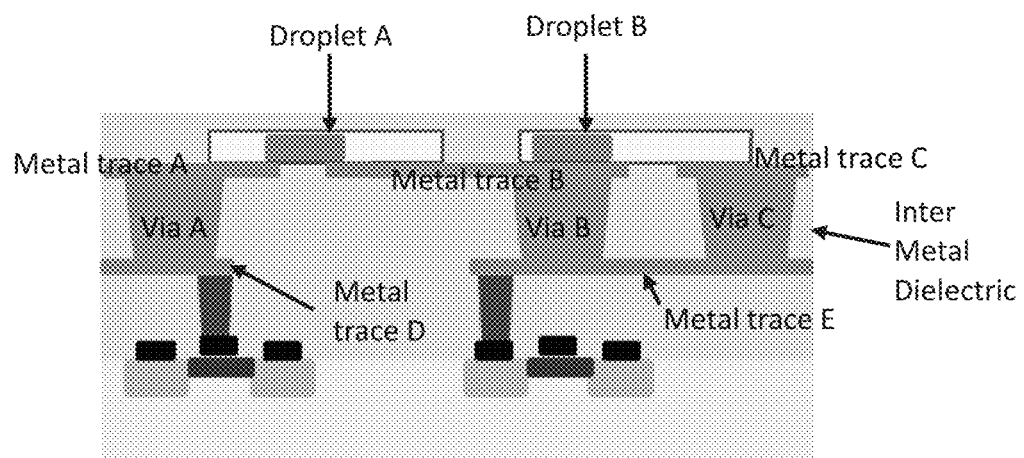
FIG. 6 shows a vanishing via including a liquid metal according to an embodiment of the subject invention.

FIG. 6 shows a vanishing via including a liquid metal according to an embodiment of the subject invention. Referring to FIG. 6, most of structure of the IC chip is similar to the structure using MEMS switches of FIG. 5 except using liquid metal droplets. The Metal trace A and the Metal trace B can be connected by a liquid metal droplet A and the Metal trace B and the Metal trace C can be connected by a liquid metal droplet B. While the droplet A is configured to electrically connect the Metal traces A and B, the droplet B is configured to electrically disconnect the Metal traces B and C. That is, by manipulating the position of the liquid metal droplet put in IC chips, interconnections can be enabled or disabled. The liquid metal can be composed of metals or metal alloys with melting points lower than the device working temperature. For example, the melting point of the liquid metal that could be used for a computer in an office may be lower than 32° F. In addition, a conductive liquid such as an electrolyte can be similarly used. The vanishing via based on liquid metal can be readily realized in methods similar to what discussed above. Instead of liquid metal, other conductive liquid such as electrolytes can be used.

Figure 7:
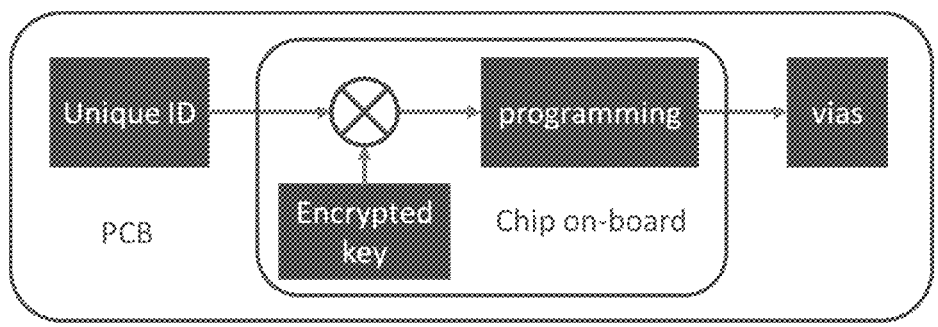
FIG. 7 shows an IC device including a PCB programmed with on-board key according to an embodiment of the subject invention.
Figure 8:
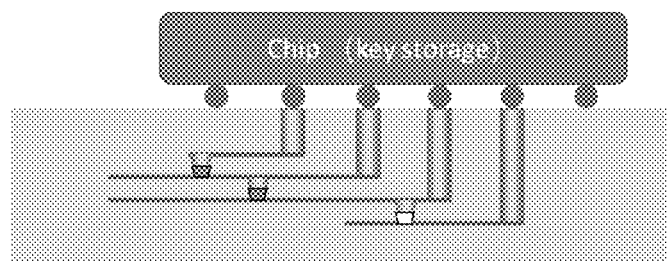
FIG. 8 shows an IC device including a ball grid array package according to an embodiment of the subject invention.

FIG. 7 shows an IC device including a PCB programmed with on-board key according to an embodiment of the subject invention, and FIG. 8 shows an IC device including a ball grid array package according to an embodiment of the subject invention.

As discussed herein, to program the connections, a secret key is required. According to the secret key, one via is selected and provided with a power as to set ON (e.g., as shown in FIG. 4), one of the MEMS switches is selected to electrically connect components (e.g., as shown in FIG. 5), and/or liquid metal droplet positions are determined (e.g., as shown in FIG. 6). Accordingly, it is important to keep the key safe. One option is to save the key off-board/chip, and provide the key from outside for each operation. For IC chips, the key can also be stored in tampering resistant memories. In the case of PCBs, the key stored on-board is more vulnerable to reverse engineering, especially probing attacks, due to the relatively large feature size of PCBs. For this, embodiments of the subject invention include a novel programming approach to protect the PCB structure and design, with reference to FIGS. 7 and 8. Referring to FIGS. 7 and 8, the IC device comprises a PCB including a unique ID and a chip mounted on the PCB and having an encrypted key, wherein the unique ID and the encrypted key are combined and decrypted as to program the vias of the PCB. The unique ID is generated from the PCB based on process-induced variations in its properties such as trace impedances, so that it is different from board to board. Before the manufacturer distributes the PCB, the secret key (i.e., configuration information of vias) is encrypted by the unique ID and stored in an IC chip on the PCB. For each operation, the unique ID is necessary to decrypt the key for via programming. To protect the information in transit between chip and vias through traces in the PCB, a ball grid array package can be used for the chip, as shown in FIG. 8. Any reverse engineering attempt that aims to extract the programming information has to detach the chip from the PCB to probe the traces. However, the removal inevitably leads to changes of trace properties (e.g., impedances), which destroys the unique ID and stops the correct programming. In addition, if an attacker were to install the chip holding the secret key on a different board, the programming would not be the same because the board's ID is different.

The subject invention includes, but is not limited to, the following exemplified embodiment.

Embodiment 1. A semiconductor device, comprising:
a first metal trace;
a first via disposed on the first metal trace;
a second metal trace disposed on the first via; and
an insulator interposed between the first metal trace and the first via,
wherein the insulator is configured to lower an energy barrier or redistribute structure defects or charge carriers, such that the first metal trace and the first via are electrically connected to each other when power is applied.

Embodiment 2. The semiconductor device according to embodiment 1, further comprising a dummy via disposed on the first metal trace.

Embodiment 3. The semiconductor device according to embodiment 2, wherein the insulator is interposed between the dummy via and the first metal trace.

Embodiment 4. The semiconductor device according to any of embodiments 1-3, wherein the insulator is $HfO_2$.

Embodiment 5. The semiconductor device according to any of embodiments 3-4, further comprising a surface adjusting material between the first via and the insulator and between the dummy via and the insulator.

Embodiment 6. The semiconductor device according to embodiment 5, wherein the first via is copper and the surface adjusting material is TiN.

Embodiment 7. The semiconductor device according to any of embodiments 3-6, wherein the insulator between the first via and the first metal trace is set as ON state and the insulator between the dummy via and the first metal trace is set as OFF state.

Embodiment 8. The semiconductor device according to any of embodiments 1-7, wherein the insulator between the first via and the first metal trace includes an atomic-level structural defect.

Embodiment 9. The semiconductor device according to any of embodiments 7-8, wherein the insulator between the first via and the first metal trace is configured to be reset as OFF state.

Embodiment 10. A method of manufacturing a semiconductor device, the method comprising:
providing a first metal trace;
depositing an inter metal dielectric on the first metal trace;
forming a first via hole and a dummy via hole in the inter metal dielectric;
depositing an insulator in the first via hole and the dummy via hole; and
depositing a via metal on the insulator in the first via hole and the dummy via hole,
wherein the insulator is configured to lower an energy barrier or redistribute structure defects or charge carriers, such that the first metal trace and the via metal are electrically connected to each other when power is applied.

Embodiment 11. The method according to embodiment 10, wherein the depositing the insulator is performed by atomic layer deposition (ALD).

Embodiment 12. The method according to any of embodiments 10-11, further comprising depositing a surface adjusting material between the insulator and the via metal.

Embodiment 13. The method according to embodiment 12, wherein the insulator is $HfO_2$ and the surface adjusting material is TiN.

Embodiment 14. The method according to any of embodiments 10-13, further comprising setting the insulator in the first via hole as ON state such that the insulator in the first via hole has low resistance.

Embodiment 15. The method according to embodiment 14, further comprising resetting the insulator in the first via hole as OFF state.

Embodiment 16. An integrated circuit, comprising:
a first metal trace;
an inter metal dielectric disposed on the first metal trace;
a first via formed in the inter metal dielectric;
a second via formed in the inter metal dielectric;
a second metal trace disposed on the first via;
a third metal trace disposed on the second via; and
a first switch between the second metal trace and the third metal trace.

Embodiment 17. The integrated circuit according to embodiment 16, further comprising a third via formed in the inter metal dielectric, a fourth metal trace disposed on the third via, and a second switch between the second metal trace and the fourth metal trace.

Embodiment 18. The integrated circuit according to embodiment 17, wherein the second switch is configured to connect the second metal trace and the fourth metal trace when power is applied and the first switch is kept as disconnected between the second metal trace and the third metal trace.

Embodiment 19. The integrated circuit according to any of embodiments 17-18, wherein the first switch and the second switch are Micro Electro Mechanical System (MEMS) components.

Embodiment 20. The integrated circuit according to any of embodiments 17-19, wherein the second switch includes a moving part that is configured to connect or disconnect the second metal trace and the fourth metal trace.

Embodiment 21. A method of manufacturing an integrated circuit, the method comprising:
providing a first metal trace;
depositing an inter metal dielectric on the first metal trace;
forming a first via and a second via in the inter metal dielectric;
forming a second metal trace on the first via and a third metal trace on the second via; and
forming a first switch between the first via and the second via,
wherein the first switch is configured to be disconnected between the first via and the second via.

Embodiment 22. The method according to embodiment 21, further comprising forming a third via in the inter metal dielectric, forming a fourth metal trace on the third via, and forming a second switch between the second metal trace and the fourth metal trace.

Embodiment 23. The method according to embodiment 22, further comprising providing the second switch with a power such that the second metal trace and the fourth metal trace are connected to each other.

Embodiment 24. The method according to any of embodiments 22-23, wherein the first switch and the second switch are Micro Electro Mechanical System (MEMS).

Embodiment 25. The method according to any of embodiments 22-24, wherein the second switch includes a moving part such that the second switch connects and disconnects the second metal trace and the fourth metal trace.

Embodiment 26. An integrated circuit, comprising:
a first metal trace;
an inter metal dielectric disposed on the first metal trace;
a first via formed in the inter metal dielectric;
a second via formed in the inter metal dielectric;
a second metal trace disposed on the first via;
a third metal trace disposed on the second via; and
a first liquid metal droplet between the second metal trace and the third metal trace.

Embodiment 27. The integrated circuit according to embodiment 26, further comprising a third via formed in the inter metal dielectric, a fourth metal trace disposed on the third via, and a second liquid metal droplet between the second metal trace and the fourth metal trace.

Embodiment 28. The integrated circuit according to embodiment 27, wherein the second liquid metal droplet is positioned such that the second metal trace and the fourth metal trace are connected to each and the first liquid metal droplet is positioned such that the second metal trace and the third metal trace are disconnected to each other.

Embodiment 29. The integrated circuit according to any of embodiments 27-28, wherein the first and second liquid metal droplets include a metal having a melting point that is lower than a device working temperature (e.g., 32° F. or lower).

Embodiment 30. A method of manufacturing an integrated circuit, the method comprising:
providing a first metal trace;
depositing an inter metal dielectric on the first metal trace;
forming a first via and a second via in the inter metal dielectric;
forming a second metal trace on the first via and a third metal trace on the second via; and
forming a first liquid metal droplet between the second metal trace and the third metal trace.

Embodiment 31. The method according to embodiment 30, further comprising forming a third via in the inter metal dielectric, forming a fourth metal trace on the third via, and forming a second liquid metal droplet between the second metal trace and the fourth metal trace.

Embodiment 32. The method according to embodiment 31, wherein the second liquid metal droplet is positioned such that the second metal trace and the fourth metal trace are connected to each and the first liquid metal droplet is positioned such that the second metal trace and the third metal trace are disconnected to each other.

Embodiment 33. The method according to any of embodiments 31-32, wherein the first and second liquid metal droplets include a metal having a melting point lower than a device working temperature (e.g., 32° F. or lower).

Embodiment 34. An integrated circuit device, comprising:
a printed circuit board (PCB) including a unique ID; and
a chip mounted on the PCB and having an encrypted key;
wherein a via of the PCB is programed by the encrypted key of the chip.

Embodiment 35. The integrated circuit device according to embodiment 34, further comprising a ball grid array connecting the PCB to the chip.

Embodiment 36. The integrated circuit device according to any of embodiments 34-35, wherein the unique ID is based on a process-induced variation.

Embodiment 37. The integrated circuit device according to any of embodiments 34-36, wherein the unique ID is a trace impedance.

Embodiment 38. The integrated circuit device according to any of embodiments 34-37, wherein the encrypted key is determined based on the unique ID.

Embodiment 39. A method of manufacturing an integrated circuit device, the method comprising:
providing a printed circuit board (PCB) including a unique ID;
mounting a chip having an encrypted key on the PCB; and
programming a via of the PCB by the encrypted key of the chip.

Embodiment 40. The method according to embodiment 39, wherein the mounting the chip is performed by a ball grid array connecting the PCB to the chip.

Embodiment 41. The method according to any of embodiments 39-40, further comprising generating the unique ID based on a process-induced variation.

Embodiment 42. The method according to any of embodiments 39-41, wherein the unique ID is a trace impedance.

Embodiment 43. The method according to any of embodiments 39-42, wherein the encrypted key is determined based on the unique ID.

Embodiment 44. The method according to any of embodiments 39-43, wherein programing the via of the PCB comprises decrypting the encrypted key based on the unique ID.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section, if present) are incorporated by reference in their entirety, including all figures and tables, to the extent they are not inconsistent with the explicit teachings of this specification.

REFERENCES

[1] M. &. M. K. Bohr, "Intel's revolutionary 22 nm transistor technology," 2011. [Online]. Available: http://download.intel.com/newsroom/kits/22nm/pdfs/22nm-Details_Presentation.pdf.
[2] M. E. International, 2011. [Online]. Available: http://www.mei4pcbs.com/technology.

What is claimed is:
1. A semiconductor device, comprising:
a first metal trace;
a first via disposed on the first metal trace;
a dummy via disposed on the first metal trace;
a second metal trace disposed on the first via; and
an insulator interposed between the first metal trace and the first via, and between the dummy via and the first metal trace,
wherein the insulator is configured to lower an energy barrier or redistribute structure defects or charge carriers, such that the first metal trace and the first via are electrically connected to each other when power is applied.

2. The semiconductor device according to claim 1, wherein the insulator is $HfO_2$.

3. The semiconductor device according to claim 1, further comprising a first surface adjusting material between the first via and the insulator and between the dummy via and the insulator.

4. The semiconductor device according to claim 3, wherein the first via is copper and the first surface adjusting material is TiN.

5. The semiconductor device according to claim 1, wherein the insulator between the first via and the first metal trace is set as ON state and the insulator between the dummy via and the first metal trace is set as OFF state.

6. The semiconductor device according to claim 5, wherein the insulator between the first via and the first metal trace includes atomic-level structural defect.

7. The semiconductor device according to claim 5, wherein the insulator between the first via and the first metal trace is configured to be reset as OFF state.

8. The semiconductor device according to claim 3, further comprising a second surface adjusting material between the first metal trace and the insulator.

9. An integrated circuit, comprising:
a first metal trace;
an inter metal dielectric disposed on the first metal trace;
a first via formed in the inter metal dielectric;
a second via formed in the inter metal dielectric;
a third via formed in the inter metal dielectric;
a second metal trace disposed on the first via;
a third metal trace disposed on the second via;
a fourth metal trace disposed on the third via;
a first switch between the second metal trace and the third metal trace; and
a second switch between the second metal trace and the fourth metal trace.

10. The integrated circuit according to claim 9, wherein the second switch is configured to connect the second metal trace and the fourth metal trace when power is applied and the first switch is kept as disconnected between the second metal trace and the third metal trace.

11. The integrated circuit according to claim 10, wherein the first switch and the second switch are Micro Electro Mechanical System (MEMS) components.

12. The integrated circuit according to claim 11, wherein the second switch includes a moving part that is configured to connect or disconnect the second metal trace and the fourth metal trace.

13. An integrated circuit, comprising:
a first metal trace;
an inter metal dielectric disposed on the first metal trace;
a first via formed in the inter metal dielectric;
a second via formed in the inter metal dielectric;
a second metal trace disposed on the first via;

a third metal trace disposed on the second via; and
a first liquid metal droplet between the second metal trace and the third metal trace.

14. The integrated circuit according to claim 13, further comprising a third via formed in the inter metal dielectric, a fourth metal trace disposed on the third via, and a second liquid metal droplet between the second metal trace and the fourth metal trace.

15. The integrated circuit according to claim 14, wherein the second liquid metal droplet is positioned such that the second metal trace and the fourth metal trace are connected to each and the first liquid metal droplet is positioned such that the second metal trace and the third metal trace are disconnected to each other.

16. The integrated circuit according to claim 14, wherein the first and second liquid metal droplets include a metal having a melting point that is lower than a device working temperature.

17. The integrated circuit according to claim 13, wherein the first liquid metal droplet include an electrolyte.

* * * * *